United States Patent
Grube

(10) Patent No.: US 7,458,123 B2
(45) Date of Patent: Dec. 2, 2008

(54) APPARATUSES AND METHODS FOR CLEANING TEST PROBES

(75) Inventor: Gary W. Grube, Pleasanton, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 11/742,960

(22) Filed: May 1, 2007

(65) Prior Publication Data

US 2007/0267041 A1 Nov. 22, 2007

Related U.S. Application Data

(62) Division of application No. 10/990,640, filed on Nov. 16, 2004, now Pat. No. 7,211,155, which is a division of application No. 09/986,751, filed on Nov. 9, 2001, now Pat. No. 6,817,052.

(51) Int. Cl.
  *B08B 11/00* (2006.01)
  *G01R 1/06* (2006.01)
  *G01R 31/02* (2006.01)

(52) U.S. Cl. .................. 15/3; 15/1.51; 15/88.4; 15/104.002; 15/246; 324/754

(58) Field of Classification Search .................. 15/1.51, 15/3, 88.4, 104.002, 246, 256.5, 102; 324/754
  See application file for complete search history.

(56) References Cited

U.S. PATENT DOCUMENTS

| | | | |
|---|---|---|---|
| 4,128,909 A | 12/1978 | Kawabe et al. |
| 4,590,422 A | 5/1986 | Milligan |
| 4,757,255 A | 7/1988 | Margozzi |
| 4,778,326 A | 10/1988 | Althouse et al. |
| 4,954,774 A | 9/1990 | Binet |
| 5,198,753 A | 3/1993 | Hamburgen |
| 5,189,752 A | 9/1993 | Miyata et al. |
| 5,476,211 A | 12/1995 | Khandros |
| 5,568,054 A | 10/1996 | Iino et al. |
| 5,690,749 A | 11/1997 | Lee |
| 5,834,946 A | 11/1998 | Albrow et al. |
| 5,917,707 A | 6/1999 | Khandros et al. |
| 5,940,921 A | 8/1999 | Wood et al. |
| 5,968,282 A | 10/1999 | Yamasaka |

(Continued)

FOREIGN PATENT DOCUMENTS

WO   WO 95/14314   5/1995

(Continued)

OTHER PUBLICATIONS

U.S. Appl. No. 09/123,949, filed Jul. 28, 1998.

*Primary Examiner*—Randall Chin
(74) *Attorney, Agent, or Firm*—N. Kenneth Burraston

(57) ABSTRACT

Apparatuses and methods for cleaning test probes used in a semiconductor testing machine of the type having a plurality of test probes configured to contact the surface of a semiconductor wafer to test one or more dies formed thereon. In one embodiment, the apparatus includes a roller-support arm and a cylindrical roller supported by the roller-support arm. The roller has an outer surface comprising a sticky material. Debris on the probes will adhere to the sticky material as roller is rolled across tips of the probes. The probes are thereby cleaned.

6 Claims, 9 Drawing Sheets

U.S. PATENT DOCUMENTS

| | | |
|---|---|---|
| 6,056,627 A | 5/2000 | Mizuta |
| 6,110,823 A | 8/2000 | Eldridge et al. |
| 6,140,616 A | 10/2000 | Andberg |
| 6,169,409 B1 | 1/2001 | Amemiya |
| 6,184,053 B1 | 2/2001 | Eldridge et al. |
| 6,211,943 B1 * | 4/2001 | Adolphi et al. ............... 355/30 |
| 6,255,126 B1 | 7/2001 | Mathieu |
| 6,662,395 B1 | 12/2003 | Hamilton et al. |
| 6,817,052 B2 | 11/2004 | Grube et al. |
| 6,840,374 B2 | 1/2005 | Khandros et al. |
| 7,211,155 B2 | 5/2007 | Grube et al. |
| 7,306,849 B2 | 12/2007 | Buckholtz et al. |

FOREIGN PATENT DOCUMENTS

| | | |
|---|---|---|
| WO | WO 96/17378 | 6/1996 |
| WO | WO 00/33089 | 6/2000 |

* cited by examiner

APPARATUSES AND METHODS FOR CLEANING TEST PROBES

CROSS-REFERENCE TO RELATED APPLICATIONS

This application is a divisional of U.S. patent application Ser. No. 10/990,640, filed Nov. 16, 2004 (now U.S. Pat. No. 7,211,155), which is a divisional of U.S. patent application Ser. No. 09/986,751, filed Nov. 9, 2001 (now U.S. Pat. No. 6,817,052).

BACKGROUND OF THE INVENTION

1. Field of the Invention

The present invention relates generally to probe cards that are used to perform tests on semiconductor devices. The present invention more particularly relates to the cleaning of probe elements that extend from such probe cards.

2. Background Art

Individual semiconductor (integrated circuit) devices (dies) are typically produced by creating several identical dies on a semiconductor wafer, using known techniques of photolithography, deposition, and the like. Generally, these processes are intended to create a plurality of fully-functional integrated circuit devices, prior to singulating (severing) the individual dies from the semiconductor wafer. In practice, however, certain physical defects in the wafer itself and certain defects in the processing of the wafer inevitably lead to some of the dies being "good" (fully-functional) and some of the dies being "bad" (non-functional). It is generally desirable to be able to identify which of the plurality of dies on a wafer are good dies prior to their packaging, and preferably prior to their being singulated from the wafer. To this end, a wafer "tester" or "prober" may advantageously be employed to make a plurality of discrete pressure connections to a like plurality of discrete connection pads (bond or contact pads) on the dies. In this manner, the semiconductor dies can be tested and exercised, prior to singulating the dies from the wafer. A conventional component of a wafer tester is a "probe card" to which a plurality of probe elements are connected—tips of the probe elements effecting the pressure connections to the respective pads of the semiconductor dies.

More specifically, in the typical wafer testing process, the probe card is mounted to the prober, and probe elements (simply referred to as "probes") extending from the probe card are brought into contact with pads formed on the dies of the wafer. In one process, electrical connection of the prober and the pads is achieved by applying a predetermined pressure to the probes after the probes have been brought into contact with the pads so that the probes penetrate the material forming the surface of the pads and come into low-resistance contact with the portions forming the bodies of the pads. Such penetration of the pad surfaces produces debris (e.g., aluminum oxide chips). In a more preferred process, used with probes that are elastic or springy, electrical connection of the prober and the pads can be achieved by applying a predetermined pressure to the springy probes after the probes have been brought in contact with the pads so that the probes are compressed, making a solid electrical connection. When the probes are compressed, a slight X and/or Y swipe is affected to the probes causing a portion of the material (e.g., an aluminum oxide film) forming the surface of the pads to be scraped off. The scraping of the pad surfaces produces debris (e.g., aluminum oxide chips).

Foreign matter including aluminum oxide chips (i.e., debris) adhering to the dies and/or the probes may obstruct proper electrical connection. Various measures have been taken to prevent problems in achieving satisfactory electrical contact.

In one conventional probe cleaning process, an abrading pad is used to remove foreign materials adhering to end portions (e.g., tips) of the probes. The abrading pad can be composed of a mixture of an elastic base material and abrasive particles. Alternatively, the abrading pad can be composed of tungsten carbide. Foreign materials adhering to the tips of the probes are scraped off the tips by repeating a cleaning cycle of pressing-and-extracting the tips of the probes against (and possibly into) the pad. The pressing-and-extracting cleaning cycle includes moving the abrading pad vertically (e.g., in the Z direction) against the probes, and then vertically away from the probes.

A disadvantage of the above described conventional cleaning process is that the portions of the base material (e.g., silicon rubber) and/or abrasive particles (e.g., abrasive grains) may fall or chip off the abrading pad during the pressing-and-extracting process, thereby producing additional foreign material that may stick to the probe tips. Further, foreign matter (previously removed from probe) that has fallen onto the abrading pad may later stick to the probes being cleaned. Accordingly, additional cleaning steps may be necessary to acceptably clean the probes.

These additional steps may include blowing an organic solvent against the probes, and then blowing dry air against the probes. The use of such solvents is undesirable for many reasons. For example, the blowing of an organic solvent is time consuming and potentially messy. Additionally, blowing of dry air is time consuming. Further, special equipment is required to blow the solvents and the dry air.

One attempt to improve upon the conventional process includes attaching a dust removing film to the top surface of the abrading pad. The purpose of the dust removing film is to confine foreign material, such as fine particles of worn base material and fallen abrasive particles produced by the repetition of the pressing-and-extracting cleaning cycle, so that those foreign materials may not be discharged outside the dust removing film. For example, this process may not be useful for cleaning elastic or springy contact probes (often referred to as "spring contacts" or "contact springs"), such as those disclosed in U.S. Pat. No. 6,184,053, entitled "Method of Making Microelectronic Spring Contact Elements," U.S. Pat. No. 5,476,211, entitled "Method for Manufacturing Electrical Contacts, Using a Sacrificial Member," U.S. Pat. No. 5,917,707, entitled "Flexible contact structure with an electrically conductive shell," U.S. Pat. No. 6,110,823, entitled "Method of modifying the thickness of a plating on a member by creating a temperature gradient on the member, applications for employing such a method, and structures resulting from such a method," U.S. Pat. No. 6,255,126, entitled "Lithographic contact elements", and PCT Publication No. WO 00/33089, entitled ""Lithographic contact elements," all of which are incorporated herein by reference.

Another attempt to improve upon the conventional probe cleaning process includes using a polymeric covered wafer to remove foreign materials following the pressing-and-extracting cleaning cycle described above. More specifically, the gel pad is positioned under the probes and then brought into contact with the probes (in a similar manner as the pressing-and-extracting using the abrading pad). The debris that has been loosened by the abrading pad, or produced by the abrading pad, sticks to the gel pad and is thereby removed from the probes. A disadvantage of this cleaning process is that an operator must typically swap the abrading pad with the gel pad during the cleaning process, because testing systems typically include only one auxiliary tray for holding such pads. This is undesirable because it prevents wafer testing from being a completely automated process, thereby significantly reducing wafer testing throughput.

Accordingly, there is a need for improved methods and apparatuses for cleaning probes.

BRIEF SUMMARY OF THE INVENTION

The present invention is directed to apparatuses and methods for cleaning test probes used in a semiconductor testing machine of the type having a plurality of test probes configured to contact the surface of a semiconductor wafer to test one or more dies formed thereon. The test probes being cleaned can be any type of probe, such as tungsten needles, vertical probes, cobra probes, L-type probes, plunger probes, spring probes, contact bump probes formed on a membrane, etc.

In one embodiment, the apparatus of the present invention includes a roller-support arm, and a cylindrical roller supported by the roller-support arm. An outer surface of the roller comprises a sticky material. Debris on the probes will adhere to the sticky material as roller is rolled across tips of the probes.

The roller can comprise an inner cylindrical portion or core, and the sticky material can be disposed on a peripheral surface of the inner cylindrical portion. The roller core spins about its longitudinal axis. Different portions of the sticky material engage against the tips of the probes as the roller core spins. Friction between the sticky material and the tips of the probes causes the roller core to spin as the arm moves in the horizontal direction.

According to an embodiment of the present invention, the roller-support arm is pivotally connected to a wafer chuck of the testing machine. The wafer chuck is typically used for supporting the semiconductor wafer to be tested. An outer circumference of the roller is below a horizontal plane of the wafer when the roller-support arm is in a first position. This enables the wafer chuck to be maneuvered without the roller engaging the probe tips. When the roller-support arm is moved to a second position, at least a portion of the outer circumference of the roller is above the horizontal plane of the wafer and aligned with a horizontal plane of the probe tips. When the arm is in the second position, the outer surface of the roller engages with and rolls across the probes tips as the wafer chuck is moved in a horizontal direction.

According to another embodiment of the present invention, the roller-support arm is connected to some other maneuvering mechanism. That is, in another embodiment, the roller is connected in no way to a wafer chuck.

In another embodiment of the present invention, the roller-support arm extends between a pair of tracks. The sticky material engages the tips of the probes as the arm moves horizontally along the tracks.

In an embodiment of the present invention, the apparatus for cleaning probes also includes a loosening means for loosening debris from the probes. The loosened debris can then be removed using the cylindrical roller having the sticky outer surface. More specifically, the loosened debris will adhere to the sticky outer surface of the roller as it is rolled across tips of the probes.

The loosening means can include a second cylindrical roller having an abrasive outer surface. The debris is loosened from the probes as the outer surface of the second roller is rolled across the tips of the probes.

The loosening means can alternatively include a block having an abrasive top surface. The debris is loosened from the probes as the abrasive top surface of the block is moved in a horizontal direction along the tips of the probes.

In another embodiment the loosening means includes an abrading pad. Debris is loosened from the probes as the abrading pad is repeatedly moved in a vertical direction against and away from the tips of the probes.

In an alternative embodiment, the loosening means includes a second cylindrical roller having a bristled outer surface. Debris is loosened from the probes as the outer surface of the second roller is rolled across the tips of the probes.

In still another embodiment, the loosening means comprises a block having a bristled top surface. Debris is loosened from the probes as the bristled top surface of the block is moved in a horizontal direction along the tips of the probes.

In another embodiment, the apparatus for cleaning of probes includes a roller having an electrostatic outer surface. An arm for supports the roller and engages the roller against tips of the probes. Debris adhering to the tips of the probes is transferred to the electrostatic outer surface of the roller as it is rolled along the tips of the probes.

A method for cleaning test probes, according to an embodiment of the present invention, includes the step of maneuvering a cylindrical roller having a sticky outer surface such that the sticky outer surface is engaged against tips of the probes. The sticky outer surface is then rolled along the tips of the probes to thereby transfer debris adhering to the probes to the sticky outer surface.

Prior to engaging the sticky outer surface of the roller against the tips of the probes, it may be beneficial to first loosen the debris. The debris can be loosened by scraping the tips of the probes against an abrasive surface. This can be accomplished by maneuvering a second cylindrical roller having an abrasive outer surface such that the abrasive outer surface is engaged against the tips of the probes. The abrasive outer surface is then rolled along the tips of the probes to thereby loosen the debris from the probes.

The debris can alternatively be loosened by repeatedly moving an abrasive surface in a vertical direction against and away from the tips of the probes to thereby loosen the debris from the probes.

In another embodiment, the debris is loosened by maneuvering a second cylindrical roller having a bristled outer surface such that the bristled outer surface is engaged against the tips of the probes. The bristled outer surface is then rolled along the tips of the probes to thereby loosen the debris from the probes.

Alternatively, a bristled surface can be moved in a horizontal direction along the tips of the probes to thereby loosen the debris from the probes.

In another embodiment, the method for cleaning test probes includes the step of maneuvering a cylindrical roller having a electrostatic outer surface such that the electrostatic outer surface is engaged or nearly engaged against tips of the probes. The electrostatic outer surface is then rolled along the tips of the probes to thereby transfer debris adhering to the probes to the electrostatic outer surface.

Further features and advantages of the present invention, as well as the structure and operation of various embodiments of the present invention, are described in detail below with reference to the accompanying drawings.

BRIEF DESCRIPTION OF THE DRAWINGS/FIGURES

The accompanying drawings, which are incorporated herein and form part of the specification, illustrate various exemplary embodiments of the present invention and, together with the description, further serve to explain the principles of the invention and to enable a person skilled in the pertinent art to make and use the invention. In the accompanying drawings.

Figure 6B:
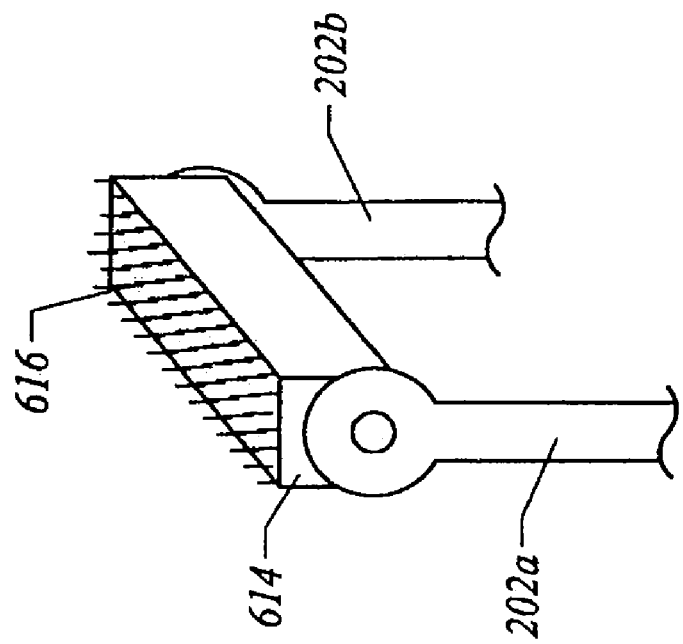
Figure 6A:
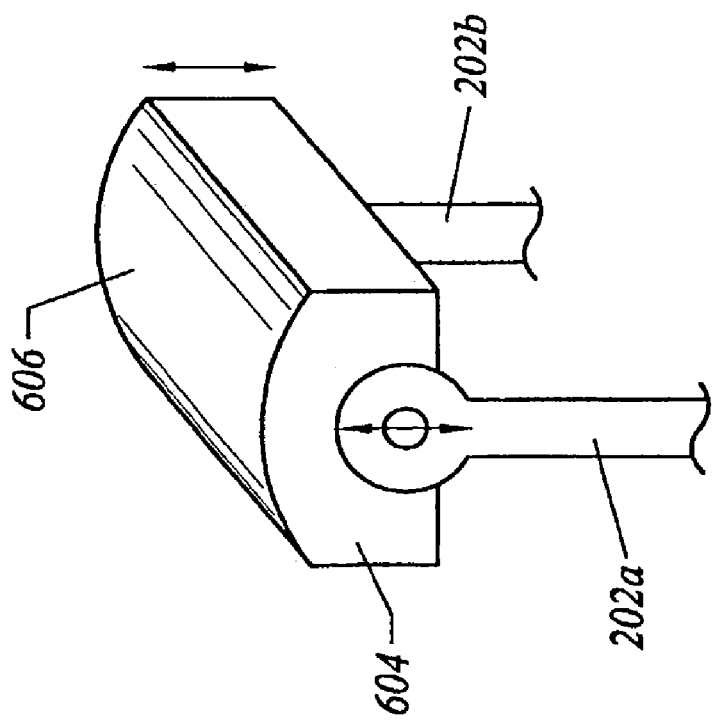
Figure 7:
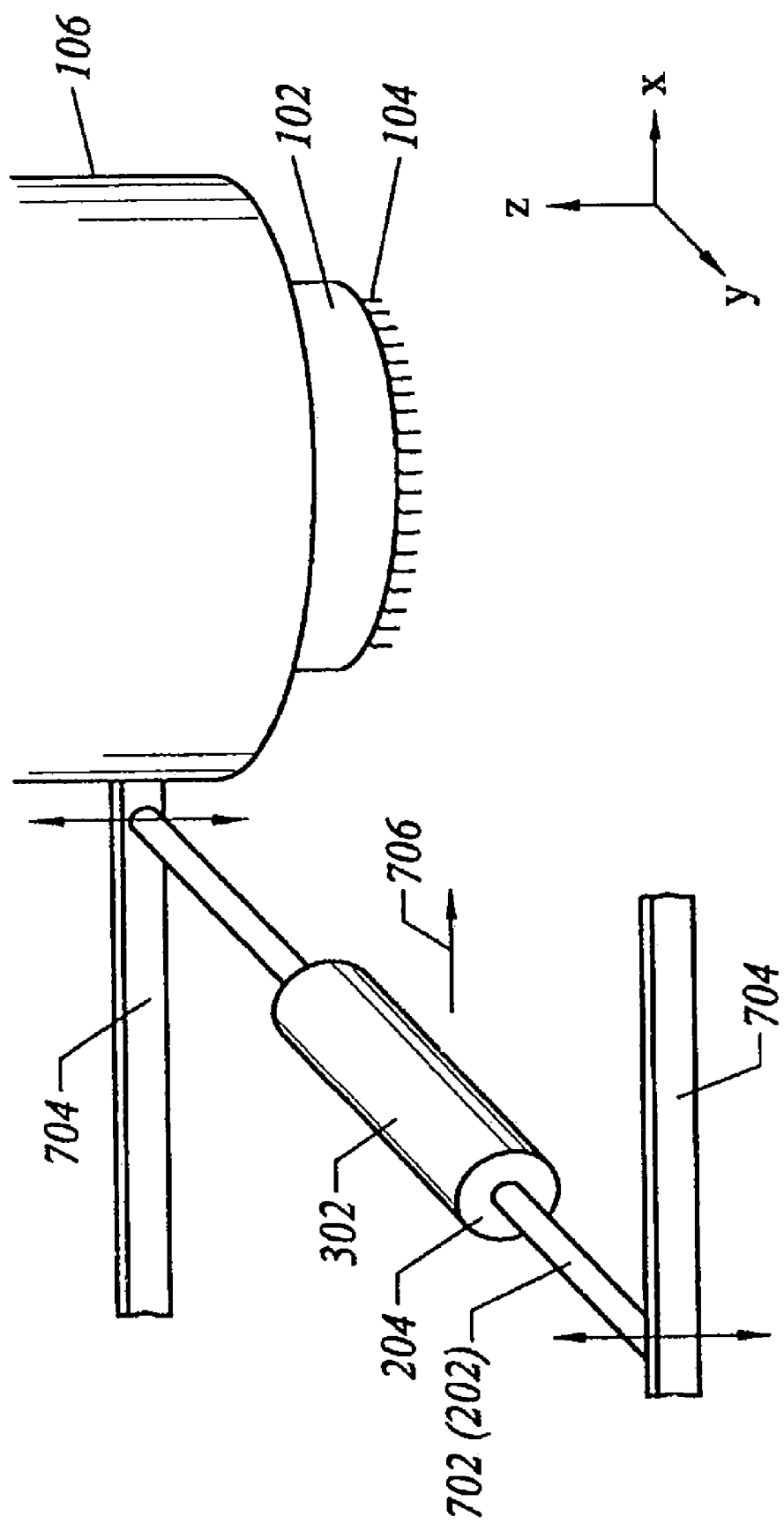
Figure 8:
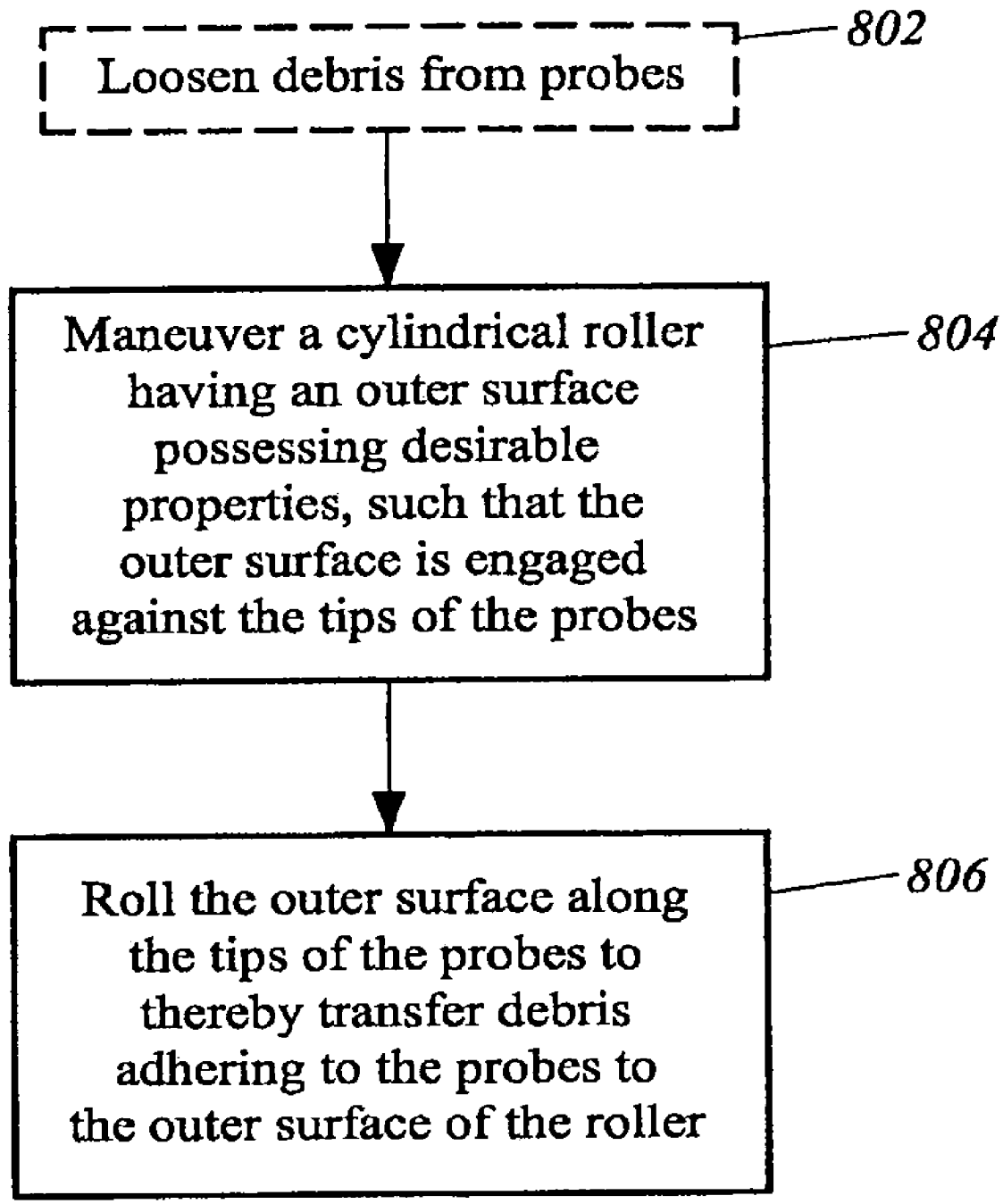
Figure 9:
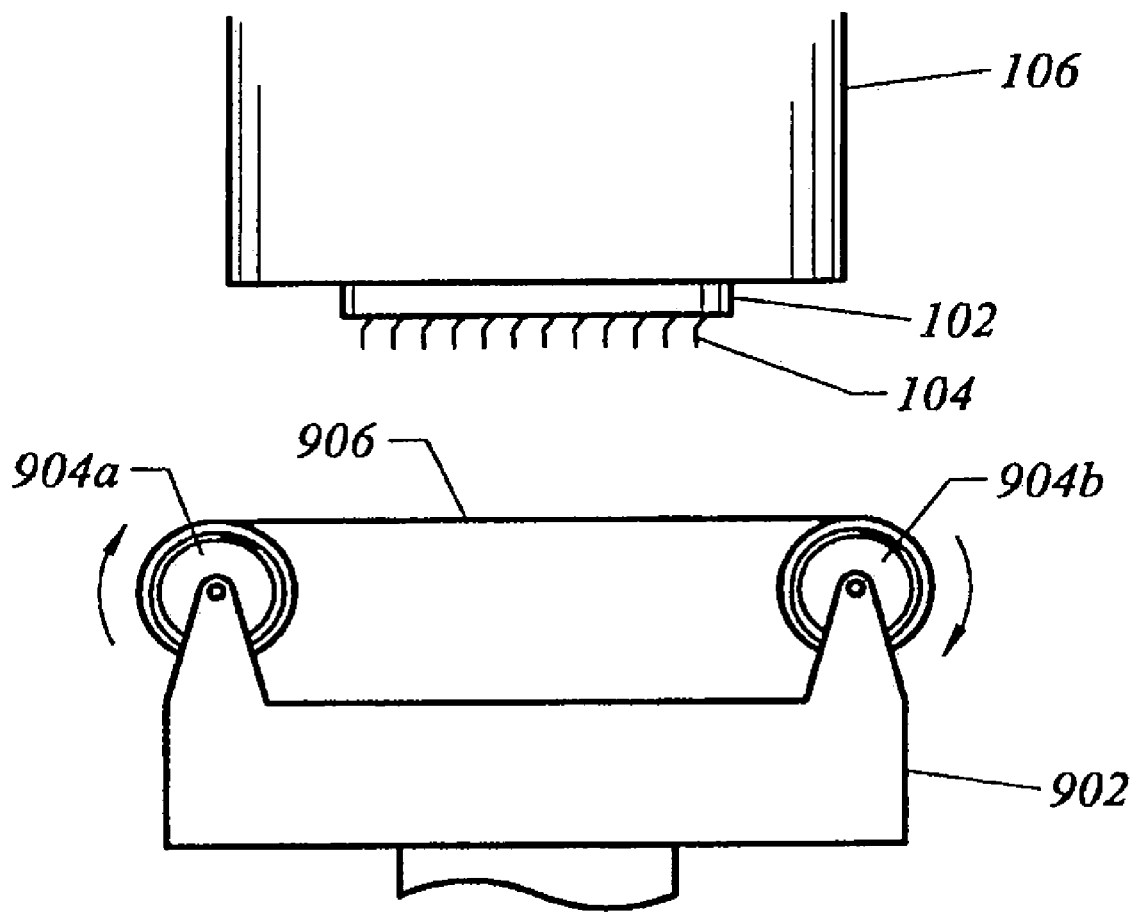

FIGS. 6A and 6B, respectively, illustrate an abrasive block and a bristled block, that can be used to loosen debris from probes, according to embodiments of the present invention;

FIG. 7 illustrates an alternative embodiment for maneuvering the rollers of the present invention;

FIG. 8 is a flow diagram useful for describing the operation of embodiments of the present invention; and FIG. 9 illustrates an embodiment of the present invention in which a sticky material, that can be used to clean tips of probes, is exposed between a pair of rollers.

DETAILED DESCRIPTION OF THE INVENTION

The following description is of the best modes presently contemplated for practicing the invention. This description is not to be taken in a limiting sense but is made merely for the purpose of describing the general principles of the invention. The scope of the invention should be ascertained with reference to the claims. In the description of the invention that follows, like numerals or reference designators will be used to refer to like parts or elements throughout.

Figure 1:
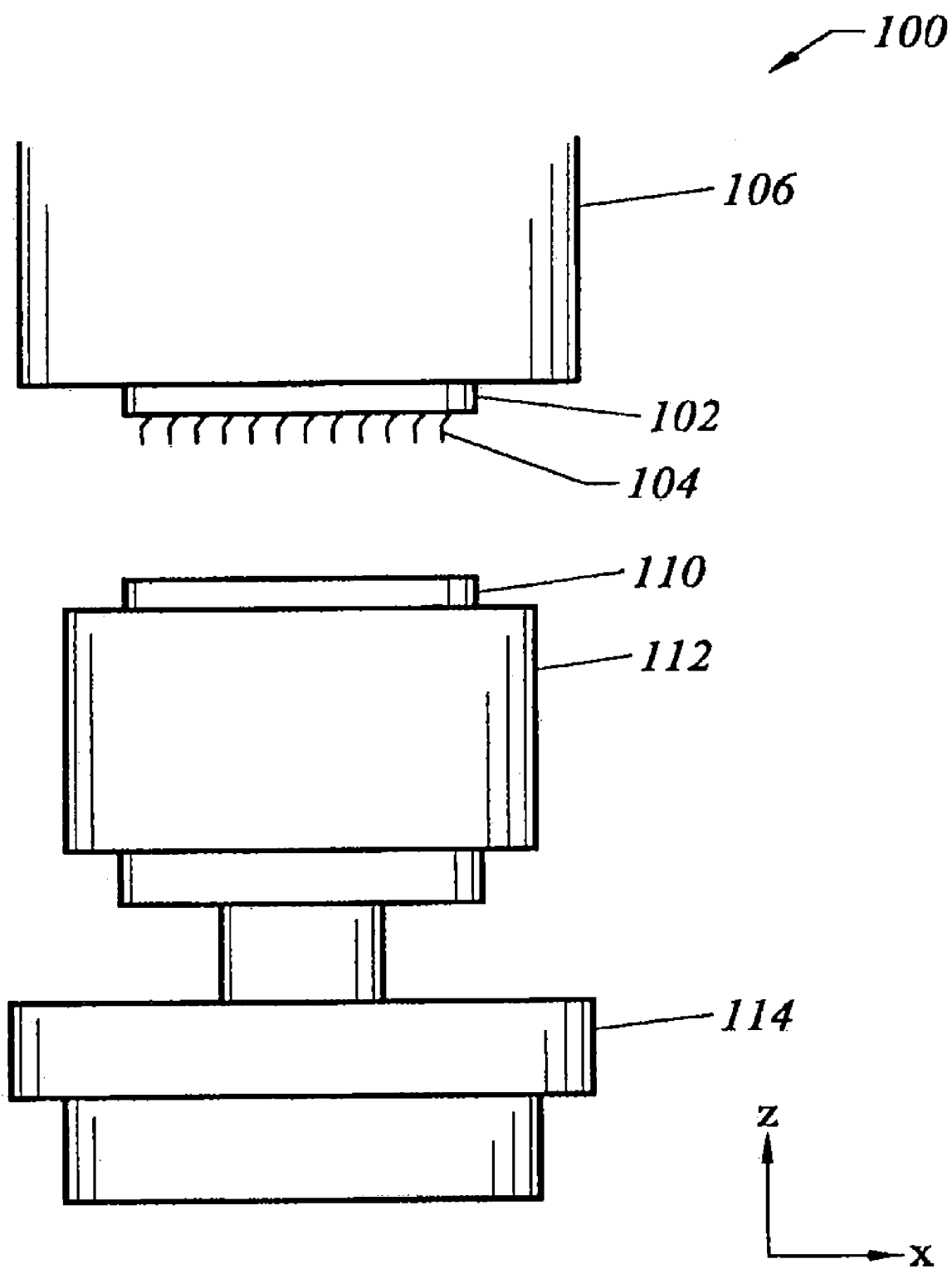
FIG. 1 is a side view of exemplary testing environment in which the present invention is useful.

FIG. 1 is a side view of a portion of an exemplary probing-test system 100 that includes a probe card 102, a test head 106 (also known as a probe head), a wafer chuck 112, and a translation mechanism 114. One of ordinary skill in the art will appreciate that these elements have not been drawn to scale. For example, the pitch of probes elements 104 extending from probe card 102 may be such that hundreds or thousands probe elements 104 may extend from probe card 102.

A semiconductor wafer 110 is supported by wafer chuck 112 (also know as a wafer stage, prober stage, or wafer holding table). Translation mechanism 114 displaces (i.e., maneuvers) wafer chuck 112 in X, Y, Z and/or θ directions as required. Translation mechanism 114 includes or is attached to an actuator type device that imparts the displacement. Wafer 110 includes a plurality of dies (not shown) formed by photolithography, deposition, diffusion, and the like, on its top surface. Each die (e.g., chip or device pattern) typically has a number of electrode contact areas, e.g., bond or contact pads (not shown), which may be disposed at any location and in any pattern on the surface of the die. Note that the terms "die" and "dice" are used throughout the specification to refer to both unsingulated die and dice, that is, a die or dice in wafer form, and individual, singulated die or dice. Typically, these dies are fabricated to be identical to one another. However, as is known, flaws in either wafer 110 itself or in any of the processes to which wafer 110 is subjected to form the dies, can result in certain dies being non-functional, according to well established test criteria.

Probe card 102 is shown above wafer chuck 112. A plurality of probe elements 104 (simply referred hereafter as "probes") extend from probe card 102. Examples of probes 104 include tungsten needles, vertical probes, cobra probes, L-type probes, plunger probes, and elastic or spring probes (such as those disclosed in the patents that were incorporated by reference above). Probes 104 make contact with the contact areas (e.g., bond or contact pads) of the dies when wafer 110 is appropriately maneuvered by wafer chuck 112. More specifically, end portions (e.g., tips) of probes 104 make contact with the contact areas on the dies so that an electrical connection is made. Accordingly, the dies of wafer 110 and the test head 106 can be electrically connected through probes 104 by moving chuck 112 upward to cause the electrode pads on the dies to contact probes 104. Tests (e.g., burn-in tests) of the dies can then be performed. Probes may also contact sacrificial pads of a scribe sheet.

When pressure is applied to probes 104, bringing probes 104 into contact with electrode pads, foreign matter chips or particles adhering to the dies and/or probes 104 can obstruct the electrical connections. Additionally, such foreign matter chips or particles (referred to collectively hereafter as "debris") originally located on the die may be transferred to probes 104. Examples of debris that may adhere to probes 104 include: aluminum, aluminum oxide, copper, chrome, gold, polyamide, titanium metal, titanium nitride, tungsten, silicon, silicon oxide, phosphor, boron and any other materials from which the dies are produced. Sometimes, even things such as dust, hair, skin, dirt and/or clothing particles may adhere to probes 104. Indeed, any material that is in a semiconductor fabrication area may become attached to the probes.

The present invention relates to improved methods and apparatuses for removing (i.e., cleaning) such debris from probes 104.

Figure 2:
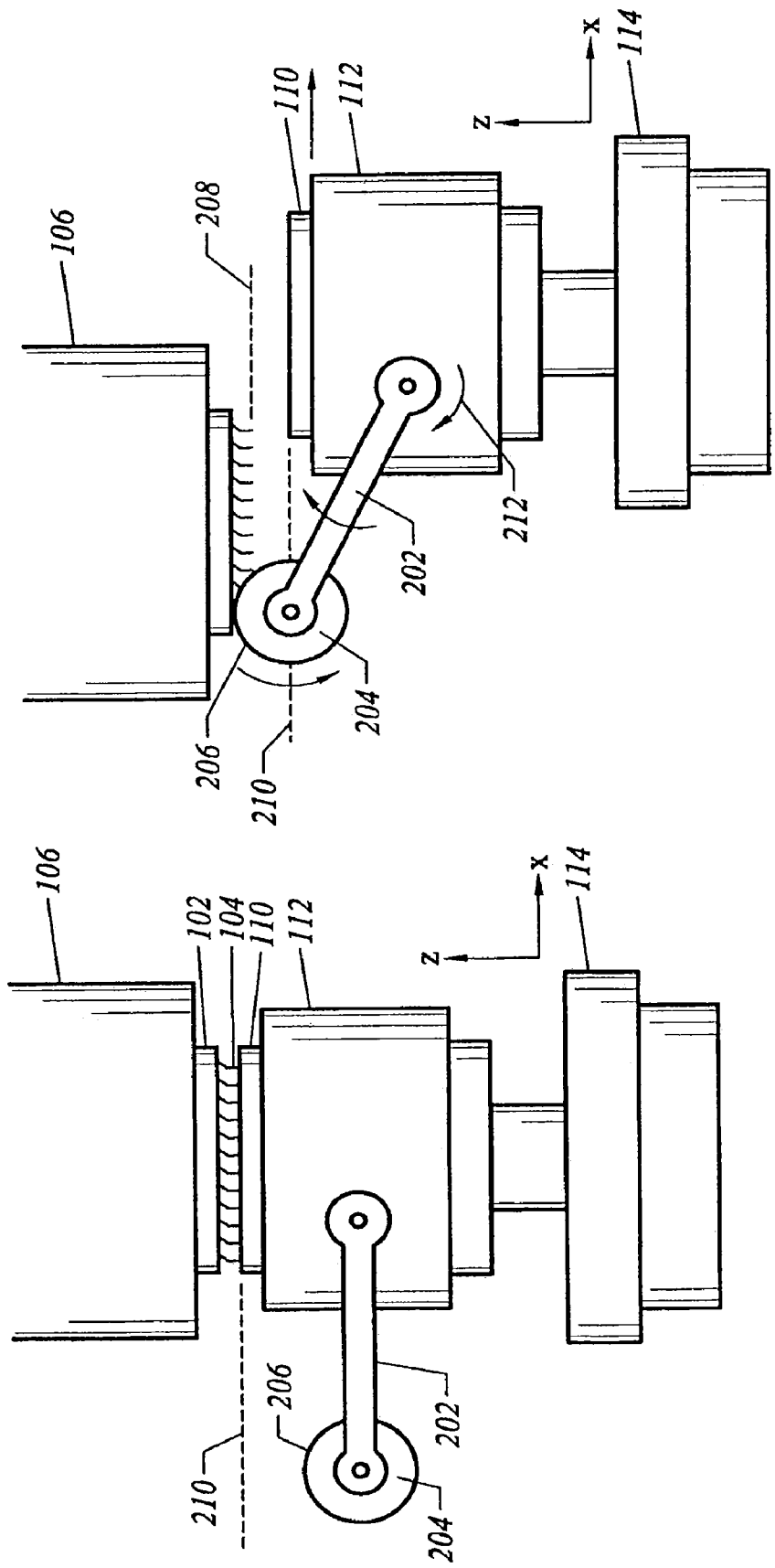
FIGS. 2A and 2B are side views of the exemplary testing environment of FIG. 1, with a roller embodiment of the present invention incorporated therewith.
Figure 3:
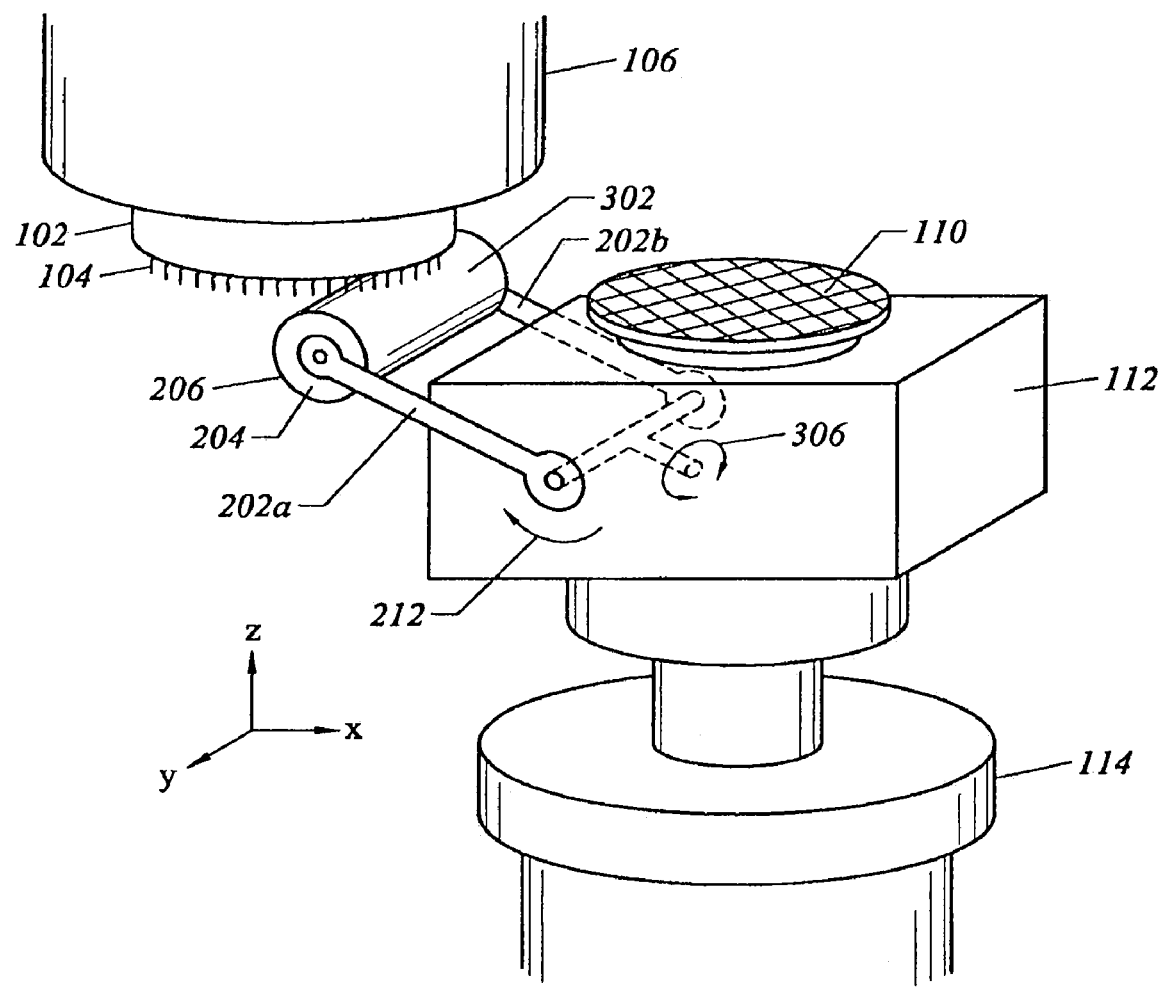
FIG. 3 is a perspective view of the exemplary testing environment of FIG. 1, with a roller embodiment of the present invention incorporated therewith.

FIGS. 2A, 2B and 3 illustrate a first embodiment of the present invention. As shown in FIG. 2A, a first end of a support arm 202 is pivotally attached to wafer chuck 112. At an opposite or second end of arm 202, a roller 204 is supported. For example, roller 204 can be pivotally attached to arm 202 at the second end of arm 202. Alternatively, roller 204 can slide onto a shaft or bar (not shown) extending perpendicularly (e.g., in the Y direction, shown in FIG. 3) from the second end of arm 202. These are just of few examples of how arm 202 can support roller 204, and thus, are not meant to be limiting. Ball bearings can optionally be used to enable roller 204 to smoothly spin or turn as an outer surface 302 (shown in FIG. 3) of roller is in contact with and moved along tips of probes 104, as described below.

When arm 202 is in a first position, as shown in FIG. 2A, an outer most circumference 206 of roller 204 is below a horizontal plane 210 of wafer 110. While arm 202 is in the first position, translation mechanism 114 and wafer chuck 112 can be used to maneuver wafer 110 such that wafer 110 is appropriately aligned under probes 104 protruding from probe card 102. At that point, translation mechanism 114 and wafer chuck 112 can maneuver wafer 110 in an upward vertical direction (e.g., the Z direction) until probes 104 make contact with the contact areas on the dies of wafer 110 so that electrical connections are made, as shown in FIG. 2A. Once the electrical connections are made, appropriate testing of the dies of wafer 110 can be performed. Accordingly, neither arm 202 nor roller 204 interfere with the normal testing of the dies when arm 202 is in the first position.

When arm 202 is moved to a second position, as shown in FIG. 2B, at least a portion of the outermost circumference 206 of roller 204 is above horizontal plane 210 of wafer 110. FIG. 3 shows a perspective view of roller 204, when arm 202 is in the second position. Additionally, when arm 202 is in the second position, outermost circumference 206 of roller 204 should be aligned with a horizontal plane 208 formed by the tips of probes 104. This will cause an outer surface 302 (shown in FIG. 3) of roller 204 to make contact with the tips of probes 104 when wafer chuck 112 moves in a horizontal direction (e.g., the X direction), as is shown in FIGS. 2B and 3.

Outer surface 302 of roller 204 should be sticky enough to remove debris from probes 104. Accordingly, roller 204 may also be referred to herein as a "sticky roller". Preferably, outer surface 302 of roller 204 should also be stable enough that it does not produce new debris that may stick to probes 104. In other words, outer surface 302 of roller 204 should generally resist transferring material to probes 104. The only material transfer should be from probes 104 to outer surface 302 of roller 204. Outer surface 302 of roller 204 can be made from any material or combinations of materials that exhibit the above described desired properties. Exemplary materials that can be used to produce outer surface 302 include, but are not limited to: polymeric materials, silicone, urethane and acrylic.

Outer surface 302 of roller 204 can have additional desirable properties. For example, roller 204 is preferably elastomeric so that it does not damage probes 104 when roller 204 is moved along the tips of probes 104.

In an alternative embodiment, rather than being sticky, outer surface 302 of roller 204 is made from an electrostatic material that can electrostatically remove debris from probes 104.

According to an embodiment of the present invention, rather than being a sticky material, outer surface 302 includes a material with micro-pores containing a cleaning agent (e.g., a basic or acidic cleaner). Accordingly, the tips of the probes can be cleaned by the cleaning agent as the outer surface of the roller as is rolled along the tips of the probes.

When arm 202 is in the second position, and wafer chuck 112 moves in a horizontal direction (e.g., the X direction), outer surface 302 of roller 204 engages (i.e., come into contact with) the tips of probes 104, as shown in FIGS. 2B and 3. Loose debris adhering to probes 104 (e.g., debris electrostatically stuck to probes 104) thereby comes into contact with and sticks to outer surface 302 of roller 204. Probes 104 are thereby cleaned. As wafer chuck 112 continues to move in the horizontal direction, friction between outer surface 302 of roller 204 and the tips of probes 104 causes roller 204 to turn about its pivotal connection to arm 202. This friction between roller 204 and probes 104, which is much less than it would be if a non-pivoting surface were scraped along the tips of probes 104, is not enough to cause probes 102 to gouge into the outer surface of roller 204. Thus, neither roller 204 nor probes 104 are damaged by this cleaning procedure.

In an alternative embodiment, rather than being pivotally connected, support arm 202 is in a fixed position that is offset from the top of wafer chuck 112, for example, fixed in the position shown in FIG. 2B.

A vertical (e.g., in the Z direction) contact force of, for example, approximately 15 grams (including as little as 2 grams or less and as much as 150 grams or more) may be desired between roller 204 and probes 104 to ensure that debris sticks to roller 204.

Arm 202 can be maneuvered from the first position to the second position (or from the second position to the first position) in any appropriate manner. For example, arm 202 can be spring loaded in the direction shown by arrow 212 to allow for cleaning pressure control. In another example, an electric motor can be used to maneuver arm 202. Alternatively, arm 202 can be pneumatically driven. In still another example, hydraulics can be used to maneuver arm 202. These examples are not meant to be limiting.

As shown in FIG. 3, more than one arm 202 can be used to support roller 204. For example, roller 204 can be pivotally connected at one of its longitudinal ends to first arm 202a and at its other longitudinal end to second arm 202b. Alternatively, a bar or shaft (not shown) can extend between arms 202a and 202b in a perpendicular direction (e.g., the Y direction) from each of arms 202a and 202b. Roller 204 can rest about the bar or shaft.

As shown in FIG. 3, arms 202a and 202b are optionally gimbal mounted to allow for accommodation of a non-planar relationship between roller surface 302 and plane 208 of probe tips 104. An arrow 306 illustrates a possible pivot direction if arms 202a and 202b were supported by an exemplary gimbal mount 304.

Roller 204 is preferably cylindrical, as can be seen in FIG. 3. Inner portions of roller 204 can be made from any number of materials, so long as outer surface 302 of roller 204 exhibits the desired properties. For example, an inner or core portion of roller 204 can be made of an inexpensive hard plastic material, and a sheet of material exhibiting some or all of the above described desired properties can be adhesively disposed on a peripheral surface of the core material.

In one embodiment of the present invention, a plurality of sheets of material having the desired properties are disposed one above the other such that each sheet sticks to a sheet of a previous layer. After a top sheet has been sufficiently covered with debris from cleaning probes, the top sheet can be pealed off such that a clean sheet of the previous layer becomes the top sheet.

In another embodiment, a cylindrical sleeve is used. The sleeve is sized so that the sleeve can be removably inserted or slid over a core of roller 204. The sleeve has disposed about its outer surface one or more sheets of material having the sticky property described herein. When the sleeve is about the core of roller 204, outer surface 302 of roller 204 is the outer surface of the sleeve.

When necessary, roller 204 can be replaced by an operator. Alternatively, spare rollers 204 can be stored at a location that allows arm 202 to automatically swipe out a used roller 204 and load in a clean roller 204. For example, spare rollers can be stored in a rack (not shown). Arm 202 can replace a roller with another roller from the rack when appropriate. In such an embodiment, it is beneficial that arm 202 be an articulating arm that can further pivot about a mid portion of the arm. This would provide arm 202 will an increased range of motion. The rollers in the rack can all be identical to one another. Alternatively, different types of rollers can be stored in the rack. For example, some rollers 204 may have an abrasive outer surface that is used to loosen debris from tips of probes 104. Other rollers 204 may have a sticky outer surface that is used to remove loosened debris. An articulating arm 202 can first obtain an abrasive roller 204 from the rack to loosen debris. Arm 202 can then replace the abrasive roller 204 with a sticky roller to remove the loosened debris.

Similarly, when a sleeve is used, the sleeve can be replaced by an operator by sliding the sleeve off a core of roller 204, and sliding a new sleeve onto the core. This operation of replacing the sleeve can alternatively be automated as just discussed above (e.g., a rack is used to store spare sleeves that can be obtained by an articulating arm 202).

Roller 204 of the present invention can be used to improve upon prior cleaning processes. For example, debris on probes 104 can first be loosened by pressing-and-extracting the tips of probes 104 against an abrading pad. The abrading pad can be made from a mixture of an elastic base material and abrasive particles. Alternatively, the abrading pad can be made from tungsten carbide or any other appropriate material whose hardness is substantially similar to the hardness of the probe tips. This will enable the abrading pad to loosen debris from tips of probes 104, while limiting any damage to probes 104. Debris adhering to the tips of probes 104 are scraped off or loose by repeating a cleaning cycle of pressing-and-extracting the tips of the probes against (and possibly into) the abrading pad. After the debris has been loosened by the pressing-and-extracting process, roller 204 of the present invention can be used to remove the loosened debris from the tips of probes 104, as described above. Accordingly, the present invention enables automated removal (i.e., without operator intervention) of the loosened debris from probes 104.

Use of roller 204 is very advantageous even if the tips of probes 104 are not first scraped or scrubbed by an abrading pad. For example, use of roller 204 without first scraping tips of probes 104 will still remove a majority of the loose debris adhering to probes 104. Accordingly, use of roller 204 will improve electrical contact between probes 104 and electrodes on dies of wafer 110 even when probes 104 are not first scraped. Further, the use of roller 204 is very practical where optical recognition sensors, e.g., cameras (not shown), are used to make sure probes 104 are appropriately aligned with electrodes on dies of wafer 110. Depending on the lighting techniques employed, loose debris on the tips of probes 104 may prevent the optical sensors from recognizing probes 104. Even without first scraping or scrubbing probes 104, roller 204 will remove enough loose debris from probes 104 so that the optical recognition sensors can recognize probes 104 and accurately perform their function.

Roller 204 of the present invention can also be used to clean contact bumps of probe membranes that are used in some wafer testers, such as those discussed in U.S. Pat. No. 5,422,574, entitled "Large Scale Protrusion Membrane For Semiconductor Devices Under Test With Very High Pin Counts," which is incorporated herein by reference.

A longitudinal length (e.g., the Y directional length) of roller 204 is preferably longer than the area of probe card 102 from which probes 104 protrude. Stated another way, roller 204 is preferably wide enough to clean all probes 104 of probe card 102 with one directional roll of roller 204. Alternatively, if roller 204 is not wide enough to clean all probes 104 with one roll, multiple rolls may be necessary.

In the above described embodiments, roller 204 is described as being moved with respect to test head 106. Alternatively, test head 106 can be moved with respect to roller 204 to thereby engage roller 204 against probes 104. Further, movement of roller 204 relative to test head 106 during probe cleaning can be in an X direction and/or a Y direction. One pass or multiple passes may be made in any pattern.

In another embodiment, a motor connected to arm 202, or within roller 204, causes roller 204 to spin even when roller 204 is not rolled along tips of probes 104. Thus, roller 204 can be spun against a specific portion of probe card 102 even when the roller is not moving in an X, Y or Z direction with respect to probe card 102.

In another embodiment, a region of outer surface 302 is a sticky material and another region is an abrasive material that is used to loosen debris. For example, 180 degrees of outer surface 302 is sticky, and the remaining 180 degrees of outer surface 302 is an abrasive. Of course, this example is not meant to be limiting. This embodiment is especially useful if roller 204 is spun by a motor.

Figure 4B:
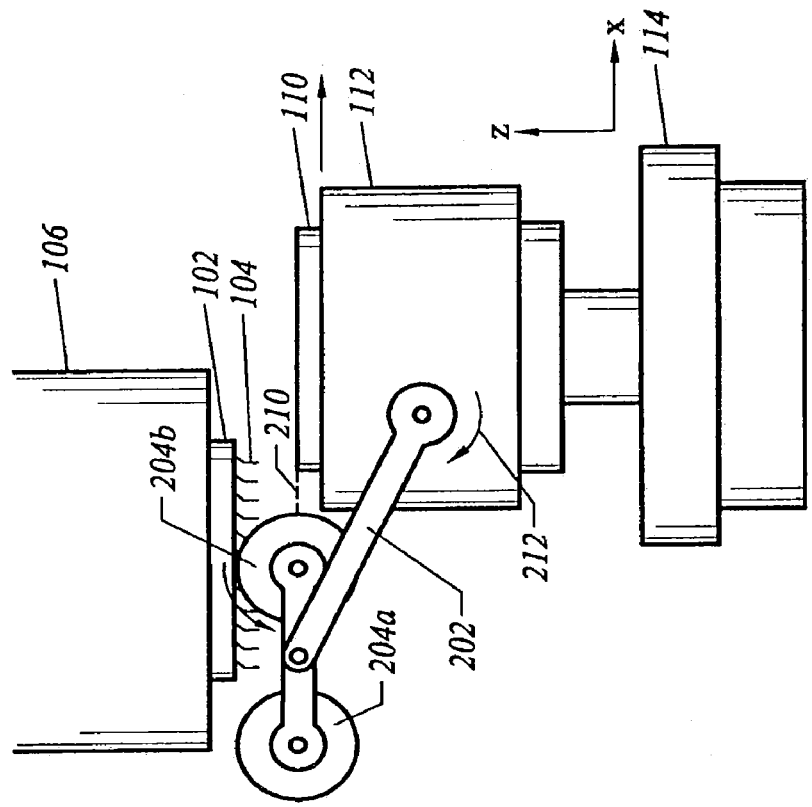
FIGS. 4A and 4B illustrate an embodiment of the present invention that incorporates multiple rollers.
Figure 4A:
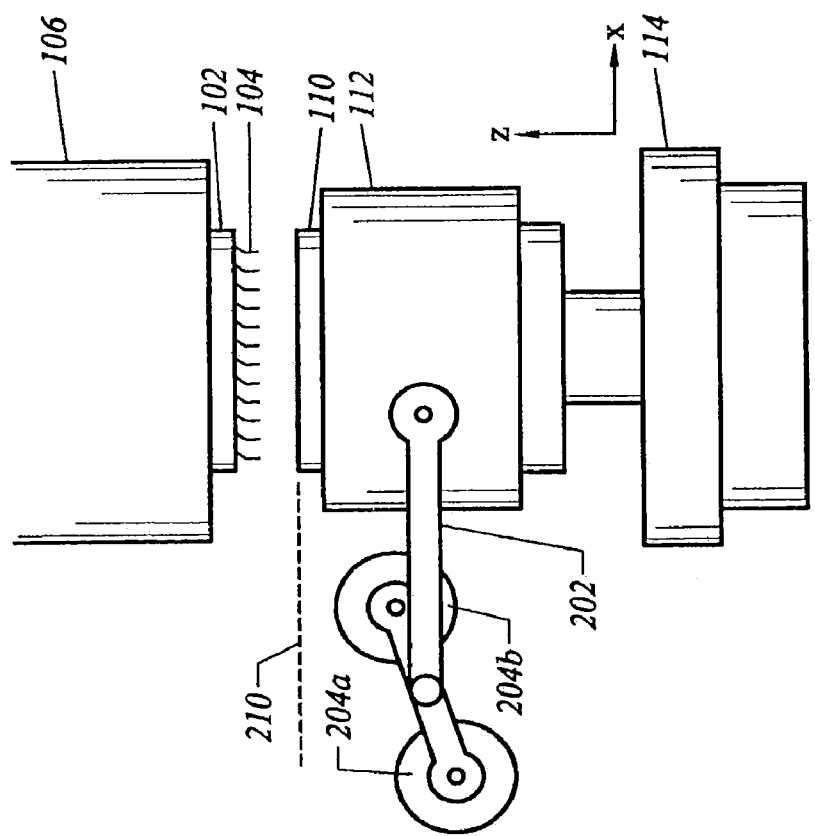

Referring now to FIGS. 4A and 4B, a plurality (i.e., two or more) rollers 204a and 204b can be used to clean probes 104. In FIG. 4A, arm 202 is in a first position such that the outer circumferences of rollers 204a and 204b are below horizontal plane 210 of wafer 110. In FIG. 4B, arm 202 is in a second position such that at least a portion of the outer circumferences of rollers 204a and 204b are above plane 210 and can contact probes 104 when wafer chuck 112 is moved in the horizontal direction (e.g., the X direction).

In one embodiment, the two rollers 204a and 204b are essentially identical in that they are both sticky rollers. Accordingly, following roller 204b would remove any debris possibly missed by leading roller 204a.

In another embodiment, leading roller 204a has an abrasive outer surface, for example, a surface made from tungsten carbide. Such a roller is thus also referred to herein as an "abrasive roller". In this embodiment, the abrasive roller (e.g., roller 204a) is used to loosen debris from probes 104. The abrasive roller can be made from any other appropriate material (e.g., tungsten carbide) whose hardness is preferably substantially similar to the hardness of the probe tips. This will enable the abrasive roller to loosen debris from tips of probes 104 while limiting damage to probes 104. The following roller (e.g., roller 204b), which is a sticky roller, is then used to remove the loosened debris from probes 104.

Figure 5:
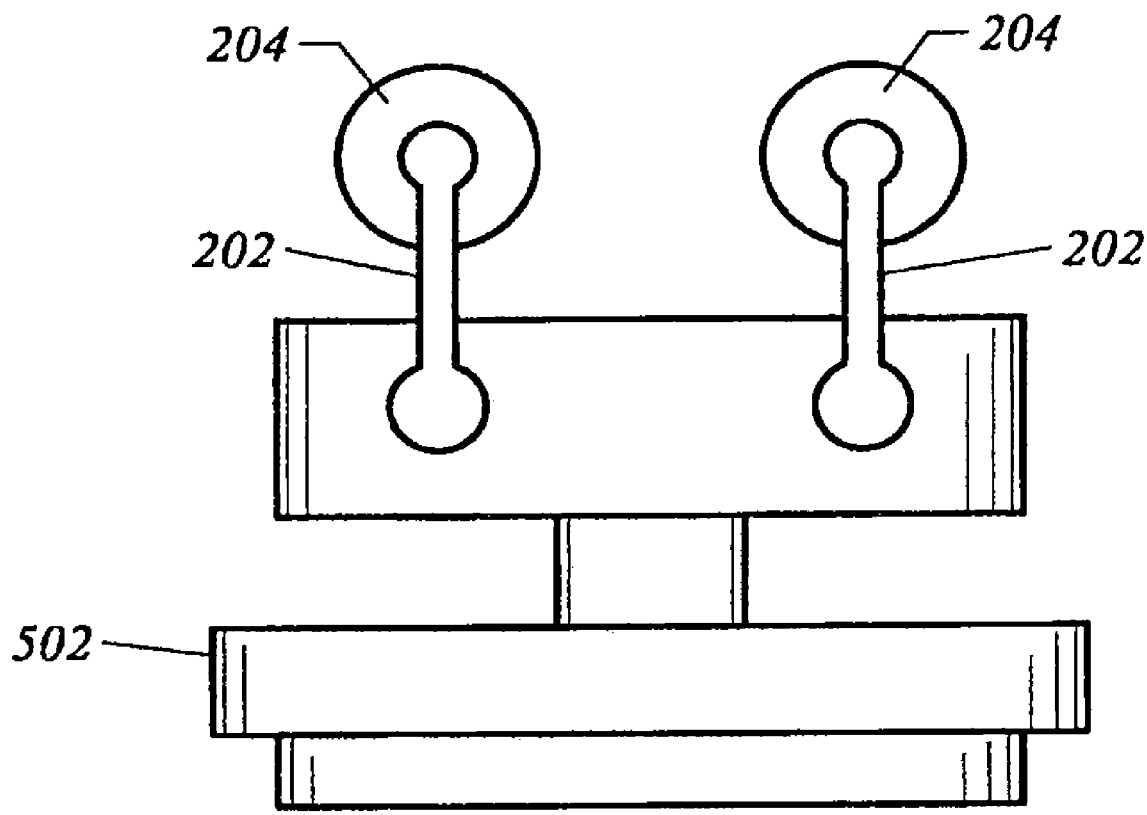
FIG. 5 illustrates an embodiment of the present invention where rollers are attached to a maneuvering mechanism other than a wafer chuck.

Both rollers 204a and 204b can be supported by a common arm 202, as shown in FIGS. 4A and 4B. Alternatively, rollers 204a and 204b can each be supported by its own dedicated arm (as shown in FIG. 5).

Preferably, when arm 202 is in the second position, and the abrasive roller (e.g., roller 204a) is engaged against (i.e., in contact with) probes 104, the abrasive roller is vertically offset from (i.e., not above) wafer 110, as shown in FIG. 4B. This will prevent debris loosened by the abrasive roller from possibly falling onto wafer 110.

In one embodiment, leading roller 204a has a bristled outer surface rather than an abrasive outer surface. The bristles of the roller are used to loosen debris from tips of probes 104.

In another embodiment, leading roller 204a is replaced by an abrasive block 604 (e.g., as shown in FIG. 6A) that does not spin or roll. A top surface 606 is preferably rounded, as shown in FIG. 6A. When arm 202 is in the second position, and top surface 606 of abrasive block 604 is engaged against probes 104, the tips of probes 104 will scrape against top surface 606 as wafer chuck 112 is moved in a horizontal direction (e.g., the X direction), thereby loosening debris. In still another embodiment, leading roller 204a is replaced by a block 614 having a bristled top surface 616, as shown in FIG. 6B. When arm 202 is in the second position, and bristled top surface 616 of block 614 is engaged against probes 104, the bristles loosen debris from tips of probes 104 as wafer chuck 112 is moved in a horizontal direction (e.g., the X direction). In either embodiment, a sticky following roller (e.g., roller 204b) is preferably used to remove the loosened debris from probes 104. Each supporting arm 202a and 202b is optionally independently suspended (e.g., using independent springs) to provide independent suspension for blocks 604 or 614.

In the above described embodiments, roller 204(s) (and possibly blocks, e.g., 604 or 614) is/are described as being supported by one or more arms 202 that is/are pivotally attached to wafer chuck 112. Arm(s) 202 can alternatively be attached to some other maneuvering mechanism 502 (other than wafer chuck 112) capable of appropriately maneuvering roller(s) 204 (and possibly blocks, e.g., 604 or 614). In one embodiment, arm(s) 202 are pivotally attached to maneuvering mechanism 502 and roller(s) 204 (and possibly blocks, e.g., 604 or 614) can be engaged against probes 104 in a manner similar to that discussed above. In another embodiment, arm(s) 202 and maneuvering mechanism 502 are integrally formed, rather than pivotally connected. The point is, roller(s) 204 (and possibly blocks, e.g., 604 or 614) need not be attached in any way to wafer chuck 112.

In one embodiment, roller 204 is supported by a bar 702 (which is an implementation of arm 202) that extends between a pair of tracks 704, as shown in FIG. 7. Tracks 704 can be attached to opposite sides of a test chamber of the wafer testing system such that roller 204 is at the appropriate vertical (e.g., Y) height. When bar 702 is moved along tracks 704 in the vertical direction 706 (e.g., the X direction) by an appropriate means, outer surface 302 of roller 204 engages with and rolls across the tips of probes 104, thereby cleaning probes 104. More than one bar 702, and thus, more than one roller 204, can be supported by tracks 704. A first roller can be an abrasive or bristled roller 204 that is followed by a sticky roller 204. Similarly, a non rolling abrasive or bristled block (such as those shown in FIGS. 6A and 6B, respectively) can be followed by a sticky roller 204. Each of track 704 can be attached to a respective side of the test chamber in such a way that independent suspension (e.g., in the Z direction) is provided for each end of bar 702.

FIG. 8 is a flow diagram useful for describing operation of the various embodiments of the present invention. More specifically, FIG. 8 can be used to describe methods for cleaning test probes 104 configured to contact the surface of a semiconductor wafer 110 to test one or more dies formed thereon. According to an embodiment of the present invention, the method includes at a step 804, maneuvering a cylindrical roller 202 having an outer surface 302 possessing desirable properties, such that the outer surface 302 is engaged against the tips of the probes 104. At a next step 806, the outer surface is rolled along the tips of the probes to thereby transfer debris adhering to the probes to the outer surface of the roller.

As described above, a desirable property of outer surface 302 of roller 202 is that it is sticky, such that debris adhering to probes 104 will be transferred from probes 104 to sticky outer surface 302 as it is rolled across the tips of probes 104. Another desired property of outer surface 302 is that it is stable enough that there is little to no material transfer of portions of outer surface 302 (e.g., chips or particles of outer surface 302) to probes 104. Preferably, material transfer is generally limited to transfer from probes 104 to outer surface 302. Other desirable properties of a sticky outer surface 302 are discussed above.

As described above, more than one sticky roller 202 can be used to clean probes 104. Accordingly, steps 804 and 806 can be repeated using, for example, a second sticky roller to thereby remove any debris not removed by a first sticky roller 202.

In another embodiment, also mentioned above, the outer surface 302 of roller 202 is made from a material that can electrostatically remove debris from probes 104.

In another embodiment, debris is loosening from the probes 104 at a step 802 (shown in dashed line), which is performed prior to step 804. As explained above, debris can be loosened in a number of different ways. For example, a roller 202 having an abrasive outer surface (i.e., an abrasive roller 202) can be engaged against the tips of the probes and then rolled across the tips of the probes to thereby loosen debris. In another embodiment, a bristled roller 202 is used in place of the abrasive roller 202. In other embodiments, both of which are described above, a non rolling abrasive block, or bristled block, is moved in a horizontal direction along the tips of probes 104. In still another embodiment, also described above, an abrading pad is repeatedly move vertically against and away from the tips of probes 104 to thereby loosen debris from probes 104.

Embodiments of the present invention can also be used in various other types of probing-test systems. For example, embodiments of the present invention can be used in a probing-test system that has an arrangement where probe card 102 and wafer 110 are vertically oriented. In this arrangement, wafer 110 (and/or probe card 102) are moved in a horizontal direction (e.g., the X or Y direction) until probes 104 make contact with the contact areas on the dies of wafer 110 so that electrical connections are made. In another type of probing-test system, the positions of wafer 110 and probe card 102 (as shown, for example, in FIGS. 1, 2A, 2B, 4A and 4B) are reversed.

Another embodiment of the present invention is described with reference to FIG. 9. At least a two rollers 904a and 904b support a sheet of material 906 having a top surface that is sticky. Accordingly, this sheet of material 906 is also referred to as "sticky sheet" 906. Rollers 904a and 904b are attached to a maneuvering mechanism 902 capable of appropriately maneuvering rollers 904a and 904b and sheet 906 that extends there-between. More specifically, maneuvering mechanism 902 can be used to move sticky sheet 906 underneath probe card 102, and then toward probe card 102 until tips of probes 104 engage against sticky sheet 906. Alternatively, probe card 102 is moved against sticky sheet 906. Debris adhering to tips of probes 104 is thereby transferred to sticky sheet 906. When appropriate, roller 904a and/or roller 904b is spun (in a clockwise or counterclockwise direction) manually or automatically (e.g., by a motor). This causes a dirty portion of sticky sheet 906 to be rolled up (e.g., about one of rollers 902a and 902b) and a clean portion of sticky sheet 906 to be rolled out (e.g., from the other one of rollers 902a and 902b) and thereby exposed.

In many embodiments described above, a roller 204 having a sticky outer surface 302 is used to clean debris from tips of probes 104 of a probe card 102. Alternatively, a roller 204 having a sticky outer surface 302 can be used to clean debris from a wafer 110. This can be especially useful for cleaning debris from the type of wafer including dies having extending spring like contacts. More specifically, this can be especially useful for removing debris that adheres to spring like contacts that extend from dies of a wafer. Additionally, debris adhering to such spring like contacts can initially be loosened using various embodiments discussed above. In wafer cleaning embodiments, an arm 202 that supports a sticky roller 204 (and/or an abrasive roller or other surface) can be connected to test head 106, or some other location, so that roller 204 can be maneuvered such that its outer surface 302 is engaged against wafer 110 (or wafer 110 can be maneuvered so that it is engaged against outer surface 302 of roller 204).

The previous description of the preferred embodiments is provided to enable any person skilled in the art to make or use the present invention. While the invention has been particularly shown and described with reference to preferred embodiments thereof, it will be understood by those skilled in the art that various changes in form and details may be made therein without departing from the spirit and scope of the invention.

What is claimed is:

1. An apparatus for cleaning comprising:
  a loosening means for loosening debris from electrically conductive probes extending from a probe card and comprising contact tips for contacting and establishing electrical connections with semiconductor dies; and
  a roller having an outer surface comprising a sticky material, wherein the loosened debris will adhere to the sticky material as the outer surface of the roller is rolled across the tips of the probes.

2. The apparatus of claim 1, wherein the loosening means comprises a second roller having a bristled outer surface, and wherein the debris is loosened from the probes as the outer surface of the second roller is rolled across the tips of the probes.

3. The apparatus of claim 1, wherein the loosening means comprises a block having a bristled top surface, and the debris is loosened from the probes as the bristled top surface of the block is moved in a horizontal direction along the tips of the probes.

4. An apparatus for cleaning probes that extend from a probe card used for testing one or more semiconductor dies, comprising:
- a loosening means for loosening debris from the probes; and
- a roller having an outer surface comprising a sticky material,
- wherein the loosened debris will adhere to the sticky material as the outer surface of the roller is rolled across tips of the probes,
- wherein the loosening means comprises a second roller having an outer surface comprising an abrasive material, and wherein the debris is loosened from the probes as the outer surface of the second roller is rolled across the tips of the probes.

5. An apparatus for cleaning probes that extend from a probe card used for testing one or more semiconductor dies, comprising:
- a loosening means for loosening debris from the probes; and
- a roller having an outer surface comprising a sticky material,
- wherein the loosened debris will adhere to the sticky material as the outer surface of the roller is rolled across tips of the probes,
- wherein the loosening means comprises a block having an abrasive top surface, and the debris is loosened from the probes as the abrasive top surface of the block is moved in a horizontal direction along the tips of the probes.

6. An apparatus for cleaning probes that extend from a probe card used for testing one or more semiconductor dies, comprising:
- a loosening means for loosening debris from the probes; and
- a roller having an outer surface comprising a sticky material,
- wherein the loosened debris will adhere to the sticky material as the outer surface of the roller is rolled across tips of the probes,
- wherein the loosening means comprises an abrading pad, and the debris is loosened from the probes as the abrading pad is repeatedly moved in a vertical direction against and away from the tips of the probes.

* * * * *